(12) United States Patent
Ford

(10) Patent No.: US 7,103,189 B2
(45) Date of Patent: Sep. 5, 2006

(54) POWER SUPPLY NOISE IMMUNITY FOR AUDIO AMPLIFIER

(75) Inventor: Jeremy M. Ford, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 849 days.

(21) Appl. No.: 09/771,102

(22) Filed: Jan. 26, 2001

(65) Prior Publication Data

US 2002/0102003 A1    Aug. 1, 2002

(51) Int. Cl.
*H02B 1/00* (2006.01)
(52) U.S. Cl. ...................... 381/123; 381/120
(58) Field of Classification Search ................. 381/120, 381/77, 79, 59, 123; 330/275, 301, 116, 330/117; 327/552
See application file for complete search history.

(56) References Cited

U.S. PATENT DOCUMENTS

| 5,194,821 | A | * | 3/1993 | Brambilla et al. ............ 330/51 |
| 5,530,636 | A | | 6/1996 | Brown |
| 5,656,869 | A | | 8/1997 | Gluskoter et al. |
| 5,672,958 | A | | 9/1997 | Brown et al. |
| 5,818,291 | A | * | 10/1998 | Tiede et al. .................. 327/538 |
| 5,909,583 | A | | 6/1999 | Hayes et al. |
| 5,910,991 | A | * | 6/1999 | Farrar .......................... 381/59 |
| 6,040,982 | A | | 3/2000 | Gandre et al. |
| 2002/0059008 | A1 | * | 5/2002 | Wood ......................... 700/94 |

* cited by examiner

*Primary Examiner*—Vivian Chin
*Assistant Examiner*—Corey Chau
(74) *Attorney, Agent, or Firm*—Haynes and Boone, LLP

(57) ABSTRACT

An audio amplifier configuration for a personal computer system optimizes performance in both the single-ended mode and the bridged mode. In a single-ended mode, as when the computer system user receives audio through headphones plugged into an external jack, a jack sense line is activated that switches into operation a power supply that is optimized for single-ended audio operation. In the bridged mode, as when the computer user receives audio from the system's internal speaker, operation is such that the audio amplifier is supplied by a power source optimized for operation in a bridged mode. In general, single-ended operation dictates that the audio amplifier power supply exhibit substantial noise immunity characteristics; whereas bridged-mode operation requires that the power supply be capable of supplying more demanding peak voltage and current excursions.

10 Claims, 2 Drawing Sheets

POWER SUPPLY NOISE IMMUNITY FOR AUDIO AMPLIFIER

BACKGROUND

The disclosure relates to personal computer systems generally and, more particularly, to an audio amplifier arrangement that selectively switches between voltage supplies, the selection depending on the computer user's election to avail himself of a particular one of two or more available speaker systems that may include, for example, either the personal computer's internal speakers or externally connected headphones.

Computer systems in general, and personal computer (PC) systems in particular, have attained widespread use in providing computer power to many segments of modern society. A conventional PC system can usually be defined as a desktop, floor standing, or portable microcomputer that includes a system unit having a system processor and associated volatile and non-volatile memory, display monitor, a keyboard, one or more diskette drives, a fixed disk storage device and an optional printer. One of the distinguishing characteristics of these systems is the use of a system board to electrically interconnect these components. PC systems may be considered information handling systems that are designed primarily to provide independent computing power either to a single user or to a relatively small group of users, as in the case of personal computers that serve as computer server systems. Accordingly, such systems are intended to be inexpensively priced for purchase by individuals or small businesses. A PC system may also include one of a plurality of peripheral or I/O devices that are coupled to the system processor and that perform specialized functions. Examples of I/O devices include modems, sound and video devices or specialized communication devices. Mass storage devices, such as hard disks, CD-ROM drives and magneto-optical drives, are also considered to be peripheral devices. Computers producing multi-media effects, i.e., sound coupled with visual images, are in increased demand as computers become used for artistic endeavors, for entertainment, and for education. In addition, the use of sound makes game playing more realistic and helps reinforce knowledge and make educational programs more enjoyable to use. Digital effects and music can also be created on the computer and played through attached speakers without the need for additional musical instruments or components.

Of course, as the audio aspect of a personal computer's operation acquire increasing significance, the design and operation of the computer's audio system, which may be taken to include, at least, audio storage and playback components, audio amplifiers, and audio outputs (speakers), attracts concomitantly greater attention. As with other aspects of the computer design, design of the audio system is confronted with the often competing considerations of performance and expense. In addition, the PC audio amplifier must exhibit both quality and flexibility of performance.

Specifically, audio amplifiers, such as those used in a majority of portable computer platforms, are configured to drive both the high-power internal speakers in bridged-mode operation, as well as the low-power, noise-sensitive, headphone/line output paths in single-ended mode. In the bridged mode (also sometimes referred to as "balanced" mode), an audio speaker is typically coupled across two differential outputs of an audio amplifier. The bridged, or balanced, configuration has a number of advantages, salient ones of which are the maximization of available voltage swing across the speaker and the rejection of common-mode signals, such as noise or DC offsets. In the single-ended configuration, the audio amplifier provides a single output, and the speaker is (usually AC) coupled between the amplifier output and a reference potential, usually ground (GND). Because, as suggested above, PC systems accommodate both internal speakers and headphones, the audio system designer is required to elect to support both the modes equally, or to allocate a performance preference to either the bridged mode or the single-ended mode. Inasmuch as the audio amplifier operating requirements applicable to use of internal speakers are dissimilar to those applicable to the use of headphones, the design challenges are not trivial. For example whereas internal speakers may be expected to present to the amplifier an impedance of a few ohms, a headphone jack may present an impedance of several ohms up to thousands of ohms. Therefore the amplifier must be designed to supply greater current levels to internal speakers then to headphones. The current demanded from the audio amplifier power supply varies proportionally to the output power required from the amplifier. Simultaneous support of both modes, while maintaining noise immunity and optimal audio performance, necessarily is attended by increased system cost and complexity. Alternatively, if either mode is afforded preference over the other, then compromises must be encountered. A preference for the single-ended mode will result in excessive power losses in the bridged mode; conversely, a preference for the bridge mode will result in exacerbated power supply noise in the single-ended mode.

In the high-power bridged mode, the power supply is required to deliver large amounts of peak power to the audio amplifier. Therefore, to prevent unwanted power loss in this high peak current configuration, the supply path is optimized to eliminate, or at least minimize, series impedances. AC noise from the power supply is a less significant concern in the bridged mode because noise voltage appearing at the output of the power supply will be common to both the positive and inverting output stages and will, therefore, effectively cancel.

In the low-power single-ended mode, the ability to effectively handle large peak currents is no longer a concern, and focus is directed to power supply noise immunity. Unlike the bridged mode, in the single-ended mode, noise that propagates to the output stage via the power supply path will not be canceled and will appear as a differential voltage at the output. In addition, typical low-power, single-ended configurations, such as headphones and external speakers, represent situations in which output noise is more perceptible to the end user, and is therefore more objectionable.

System designers have exploited various methods of providing power supply noise immunity in high-current configurations. In one approach, the audio system power supply is optimized for peak current-handling capability. Only passive noise immunity, usually in the form of bulk or small bypass capacitance filtering of the rectified voltage derived from the AC power line, is provided. This approach is typified by the circuit configuration depicted in FIG. 1, which represents a single channel of a typical stereo implementation.

As may be seen in FIG. 1, the audio system of a PC may be generally represented as including an audio amplifier 10 coupled through an input capacitor C1 to an input signal. (The source of the input signal to audio amplifier 10 is not considered an aspect of the invention herein.) A typical implementation of a bridge-type audio amplifier 10 includes both an inverting amplifier 11 and a noninverting amplifier 12. The input signal, which may be provided by a preamplifier (not shown), is coupled both to input 121 of noninverting amplifier and to input 111 of the inverting amplifier. Output 122 of the noninverting amplifier is coupled to one end of speaker 20, and output 121 of inverting amplifier 11 is coupled to the opposite end of speaker 20. In this manner, speaker 20 is provided a balanced signal from amplifier 10, and the amplifier is said to operate in a balanced, or bridged, mode.

As shown in FIG. 1, amplifier output 112 may be coupled to speaker 20 through a switch SW1 that is driven by a jack-sense indicator 50. In general, jack-sense indicator 50 operates to detect the insertion of headphones, or an equivalent ancillary speaker system, into jack 40. Many implementations of jack-sense indicator 50 are available to those acquainted with the art. For example, jack-sense indicator 50 may simply operate to detect the impedance to GND present at jack 40. If headphones are not connected, then the detected impedance is high, and may be taken to approach infinity. If headphones are connected, then the impedance at jack 40 will be below some nominal predetermined threshold, say 100 Kohms. Jack-sense indicator 50 then responds by providing a logic-level signal at its output. In an exemplary embodiment, jack-sense indicator may provide a logic-level ONE when headphones are connected, and logic-level ZERO otherwise. Alternatively, jack-sense indicator 50 may be integrated into one device with audio jack 40. An example of such a device is commercially available from Foxconn International, Inc., Sunnyvale, Calif. In this approach, jack-sense indicator 50 is simply mechanical switch that is driven by headphones that are inserted into jack 40. The switch may be wired so that it connects to GND when no headphones are inserted, and connects through a pull-up resistor to a DC voltage (logic-level ONE) when headphones are connected.

The binary output of jack-sense indicator 50 is coupled to SW1 and determines the condition (open, closed) of SW1. The amplifier design arbitrarily assumes that headphones are not connected, so that amplifier output 112 is normally connected (that is, SW1 is normally closed) to speaker 20 through speaker connection 22. With SW1 closed, amplifier output 112 is connected to speaker 20. However, when headphones are connected to headphone/line out jack 40, jack-sense indicator causes SW1 to be driven open, and a signal path between amplifier 10 and speaker 20 is interrupted. Specifically, the connection between amplifier output 112 and speaker 20 is broken by SW1. Nevertheless, the connection from amplifier 10 to jack 40 is maintained from output 122 of noninverting amplifier 12 through a coupling capacitor C2. In this configuration, amplifier 10 is said to operate in the single-ended mode.

The operation of amplifier 10 is enabled by a voltage supply system 30. Voltage supply system 30 is shown to include a DC voltage source, $V_{DD}$, that is derived from the AC power line (not shown). Voltage source $V_{DD}$ may, in fact, be generated simply by rectification of the AC power line, and by filtering the rectified voltage with a line filter capacitor. (It should be recognized, however, that the invention is not predicated on the manner in which $V_{DD}$ is generated.) Voltage source $V_{DD}$ is coupled to a voltage supply node 13 associated with amplifier 10 and is coupled from node 13 to both amplifier 11 and amplifier 12. In addition, voltage supply system 30 is shown also to include an undesired figurative noise source, $V_N$, that operates additively with respect to $V_{DD}$. For the pedagogical purposes of this Description, $V_N$ is intended to represent noise signals that may derive from any one or more of a number of ambient sources, or may represent the manifestation of a number of phenomena. For example, $V_N$ may represent unfiltered random noise that is present on the AC line. Additionally, $V_N$ may represent unfiltered ripple at 60 Hz, or some harmonic thereof, that results from rectification of the AC line. Further, $V_N$ may represent a contaminant signal of external origin, such as noise generated by the PC hard disk system. The point, however, is that $V_N$ represents a spurious, and undesired, signal that is ultimately coupled to voltage supply node 13.

It is readily appreciated, therefore, that the arrangement of FIG. 1 results in increased susceptibility to (especially low-frequency) power supply noise in the single-ended mode. Consequently, noise present at the amplifier voltage supply node 13, including but not limited to noise generated by the hard drive or power supply hum, will be coupled to, and therefore readily perceptible on, the headphone and line output paths.

An available response to the above-described problem may be had by the inclusion of a voltage regulator in series with the power amplifier supply path. Although this approach does provide some rejection of the random noise, $V_N$, present on the $V_{DD}$ line, it is accompanied by a significant increase in system size and cost. In addition, the voltage regulator will necessarily limit output power in the bridged mode as a result of the attendant series voltage drop and likely current limitations.

Accordingly, what is desired is an audio configuration for a PC that tends to optimize performance in both the bridged mode as well as in the single-ended mode. In bridged mode, the power supply should satisfy high peak-power requirements. In the single-ended mode, the power supply should afford substantial noise immunity. The resulting design preferably provides the desired performance without serious penalties in area of system cost and complexity. In addition, the solution should be amenable to implementation through convential integrated circuit design techniques.

SUMMARY

The above and other objects, advantages and features are achieved in one aspect of the disclosure by an audio system for use with a personal computer. The audio system comprises a first voltage supply; a second voltage supply; an audio amplifier; a connector for connecting a first speaker to the audio amplifier; and a jack for coupling a second speaker to the audio amplifier. A jack sense line is coupled to the jack, the jack sense line assumes a firs condition when a speaker is connected to the jack and assumes a second condition when a speaker is not connected to the jack. A switch is coupled to the first voltage supply, to the second voltage supply, and to the audio amplifier. The switch operates in response to the first condition of the jack sense line to couple the first voltage supply to the audio amplifier and operates in response to the second condition of the jack sense line to couple the second voltage supply to the audio amplifier.

In another aspect, a personal computer system comprises an audio system, which audio system in turn comprises a voltage supply subsystem having a first output and a second output and a power amplifier subsystem having a first stage with a noninverting output and a second stage with an inverting output. A first speaker is coupled between the inverting output and the noninverting output, and a jack is provided for a second speaker. A mode switch is coupled to the voltage supply subsystem and to the power amplifier subsystem. A jack sense line is coupled between the jack and the mode switch to cause the audio system to operate in a single-ended mode when the second speaker is coupled to the jack and in a bridged mode when the second speaker is not coupled to the jack. In one embodiment, the second speaker may, in fact, be a pair of headphones.

The disclosure may also be perceived in an apparatus that comprises a personal computer chassis having a connector for speakers and a jack for headphones. An audio amplifier system including an audio amplifier is enclosed within the computer chassis. A jack sense indicator is coupled between the jack and the audio amplifier system and is operable to provide a first indication when headphones are connected to the jack and a second indication when headphones are not connected in the jack. The apparatus also includes dual-mode voltage supply comprising a first voltage source and a second voltage source. A switch is coupled to the dual-mode voltage supply and to the jack sense indicator for coupling the first voltage source to the audio amplifier when headphones are connected to the jack and for coupling the second voltage source to the audio amplifier when headphones are not connected to the jack.

The disclosure may be exploited as a method of providing power to an audio amplifier in a personal computer system. The method comprises providing a voltage supply system that includes a first voltage source and a second voltage source; detecting whether secondary speakers are connected to the personal computer; and coupling the first voltage source to the audio amplifier when secondary speakers are connected to the personal computer and coupling the second voltage source to the audio amplifier when secondary speakers are not connected to the personal computer.

In yet another aspect, a computer system comprises a dual-mode audio amplifier arrangement that selectively operates in either a single-ended mode or in a balanced mode. The audio amplifier arrangement comprises an audio amplifier having a first output terminal, a second output terminal and a voltage supply terminal. The single-ended mode, an audio output signal appears between the first output terminal and GND, and in the balanced mode, an audio output signal appears between the first output terminal and the second output terminal. The computer system also comprises a first voltage supply, a second voltage supply, and a mechanism for selectively coupling the first voltage supply to the voltage supply terminal in the single-ended mode and coupling the second voltage supply to the voltage supply terminal in the balanced mode.

In another manifestation of the disclosure, an audio amplifier system in a personal computer system comprises a first amplifier stage and a second amplifier stage, with each of the amplifier stages having, respectively, an input, an output, and a voltage supply connection. The amplifier system also comprises a first speaker connection and a second speaker connection, with a jack (for headphones or similar optional ancillary listening devices) coupled to the first speaker connection. A first voltage supply and a second voltage supply are coupled to a voltage supply node. The first voltage supply is designed to be coupled to, and derived from, an AC line. A first switch element is coupled to the jack-sense indicator and has a pole coupled to the output of the second amplifier stage and has a contact coupled to the second speaker connection. A second switch element has a pole connected to the voltage supply connection of the first amplifier stage, a first contact coupled to the voltage supply node, and a second contact coupled to the second voltage supply. The jack-sense indicator is coupled to the first switch element and to the second switch element and operates to determine the respective conditions of the switch elements in response to a determination whether speakers are connected to the jack. In a specific implementation of the embodiment summarized above, if the jack-sense indicator determines that speaker(s) are not connected to the jack, then the jack-sense indicator causes the pole of the first switch element to be connected to its contact so that the output of the second amplifier stage is coupled to the second speaker connection and causes the pole of the second switch element is connected to its first contact so that the first voltage supply is disconnected from the voltage supply connection of the first amplifier stage. Conversely, if the jack-sense indicator determines that speaker(s) are connected to the jack, then the jack-sense indicator causes the pole of the first switch element to be disconnected from its contact so that the output of the second amplifier stage is not coupled to the second speaker connection and causes the pole of the second switch element to be connected to its second contact so that the first voltage supply is not coupled to the voltage supply connection of the first amplifier stage and second voltage supply is connected to the voltage supply connection of the first amplifier stage.

BRIEF DESCRIPTION OF THE DRAWINGS

The present disclosure may be better understood, and it's numerous objects, features, and advantages made apparent to those skilled in the art by referencing the accompanying drawings, in which.

The use of the same reference symbols in different drawings indicates identical items unless otherwise noted.

DETAILED DESCRIPTION

For a thorough understanding of the subject disclosure, including a mode for carrying out the disclosure, reference is made to the following Detailed Description, including the appended Claims, in connection with the above-described Drawings. The Description is intended to be illustrative of the disclosure and is not to be construed in a manner that circumscribes the scope of protection properly attributed to the disclosure.

Figure 2:
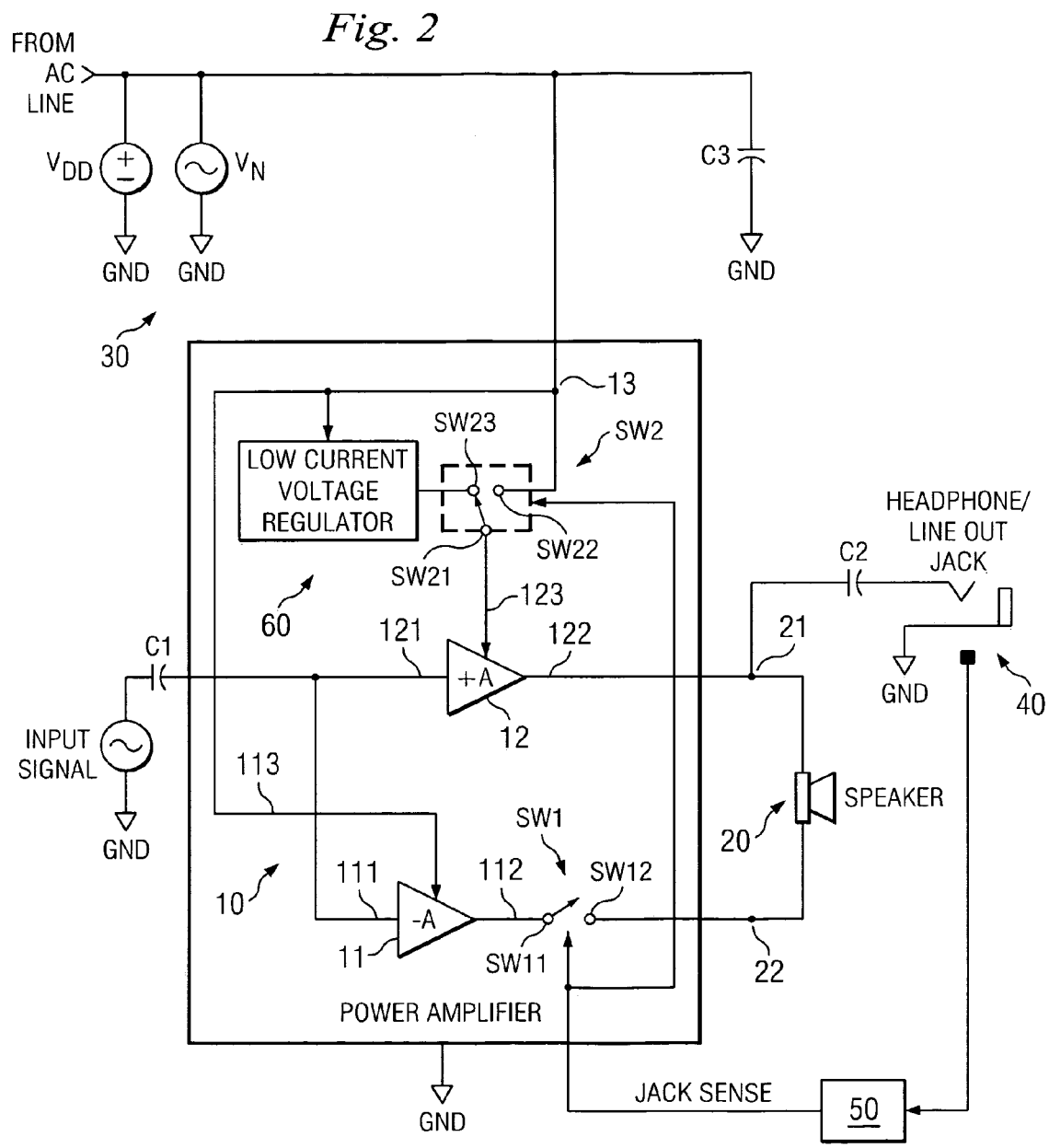
FIG. 2 is a circuit diagram depicting an embodiment in which the voltage supply portion of the amplifier system is configured to enable more nearly optimal performance in both the bridged and the single-ended modes.

Referring now to FIG. 2, depicted therein is one channel of a two-channel (i.e., stereo) audio amplifier arrangement for a PC that enables more nearly optimal operation in both the high-power bridged mode as well as in the low-power, single-ended mode.

Figure 1:
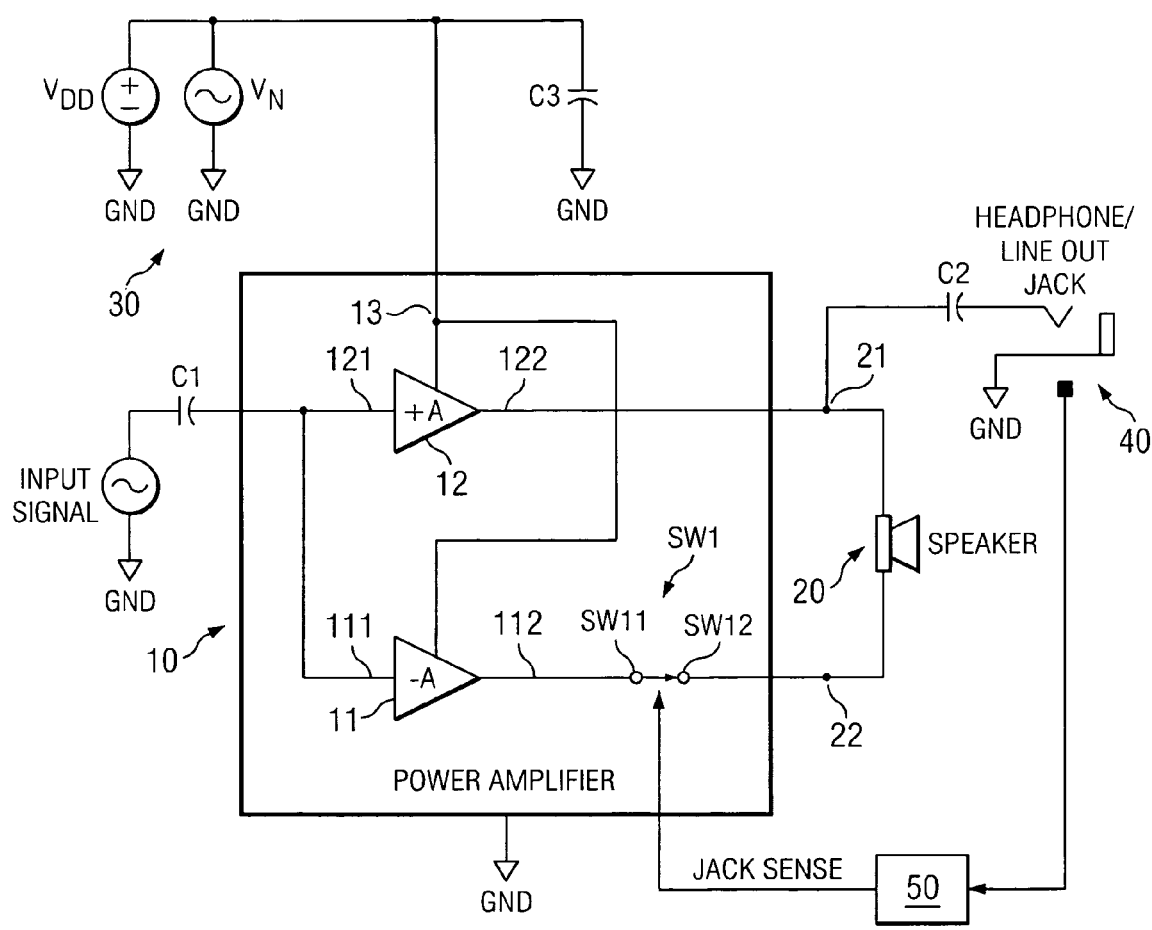
FIG. 1 is a circuit diagram of a conventional amplifier system that operates in both the bridged and single-ended modes. The voltage supply depicted therein is one that has been more nearly optimized for the high-power output required in the bridged mode.

In a manner similar to that of FIG. 1, the audio amplifier system of FIG. 2 includes an audio amplifier 10 coupled through an input capacitor C1 to an input signal. Audio amplifier 10 includes both an inverting amplifier 11 and a noninverting amplifier 12. The input signal is coupled in parallel to both input 121 of noninverting amplifier 12 and to input 111 of inverting amplifier 11. Output 122 of noninverting amplifier 12 is coupled to a first speaker output connection 21. Output 112 of inverting amplifier 11 is coupled through a switch SW1 to a second speaker output connection 22. SW1 includes a pole SW11 and a contact SW12.

As shown in FIG. 2, the output of amplifier 11 is coupled to connection 22, and therefore to speaker 20, only when SW1 is closed. For reasons that will be made apparent below, SW1 is shown in FIG. 2 to be open. As indicated above, SW1 is driven by a jack-sense indicator 50 that operates to detect the insertion of headphones, or an equivalent (optional) listening device, into jack 40. When jack-sense indicator 50 determines that headphones are connected to jack 40, jack-sense indicator 50 will cause SW1 to be driven open, and the signal path between amplifier 11 and speaker 20 is interrupted. Specifically, the connection between amplifier output 112 and speaker 20 is broken by SW1 in response to the operation of jack-sense indictor 50. Nevertheless, the connection from amplifier 10 to jack 40 is maintained in tact from output 122 of noninverting amplifier 12 through capacitor C2.

To the extent so far indicated, operation of audio amplifier system of FIG. 2 is substantially identical to the related art embodied in FIG. 1. That is, amplifier 10 includes two outputs, 122 and 112, that are normally connected in the bridged mode through respective connections 21 and 22 to a speaker 20. In addition, noninverting output 122 is coupled through connection 21 and output coupling capacitor C3 to headphone/line out jack 40. The connection to output jack 40 is substantially permanent and permits single-ended operation of amplifier 10. However, when headphones are deployed in jack 40, bridged mode operation of amplifier 10 is terminated, or disabled, through the opening of SW1 and consequent disconnection of output 112 from connection 22.

A significant operational enhancement is achieved in the audio amplifier system of FIG. 2, however, largely by the inclusion of additional capabilities in voltage supply system 30. As before, voltage supply system 30 is shown to include a voltage source $V_{DD}$ that is derived from the AC power line. $V_{DD}$ is coupled to a voltage supply node 13, and is contaminated with an undesired noise voltage $V_N$. However, the embodiment of FIG. 2 includes an additional switch SW2 that is coupled to, and driven by, jack-sense indicator 50 and includes a second voltage supply 60. The arrangement depicted in FIG. 2 enables voltage supply system 30 to operate as a dual-mode voltage supply in response to the operation mode of the audio amplifier.

SW2 has a pole terminal SW21 that is connected to voltage supply connection 123 of noninverting amplifier 12. A first contact SW22 of SW2 is coupled to voltage supply node 13 and to $V_{DD}$. A second contact SW23 of SW2 is coupled to an output of a low-current voltage regulator 60. As shown in FIG. 2, regulator 60 is coupled to voltage supply node 13 and is derived from $V_{DD}$.

As to operation, in the absence of headphones (or the like) at jack 40, SW1 is closed and SW2 is caused to be in a condition so that pole SW21 is contacted to first terminal SW22. If Operation in the absence of headphones is arbitrarily assumed to be the "normal," mode of operation, then SW2 May be assumed to be "normally" closed and, SW22 may be considered the "normally closed" terminal of SW2. In this mode, $V_{DD}$ is coupled to node 13. Voltage supply node 13 is coupled directly to voltage supply connection 113 of inverting amplifier 11 and is coupled through SW2 to voltage supply connection 123 of noninverting amplifier 12. However, when headphones are inserted in jack 40, jack sense indicator 50 causes pole SW21 of SW2 to be contacted with second terminal SW23. In this mode, the output of regulator 60, rather then VDD, is coupled through SW2 to voltage supply connection 123 of noninverting amplifier 12. Accordingly, in the single-ended mode of operation, the voltage supply to amplifier 12 is provided by regulator 60 rather than by $V_{DD}$. This arrangement allows the design of regulator 60 to be more nearly optimized to correspond to the requirements of single-ended operation. For example, regulator 60 may be conveniently designed by skilled practitioners to provide enhanced noise-immune performance in the manner appropriate for single-ended operation into headphones or the like. In addition, because the power required to be delivered to jack 40 is generally modest, regulator 60 may be designed for low-current operation, thereby enhancing energy efficiency.

Accordingly, although while particular embodiments of the present disclosure have been shown and described, it will be recognized by those skilled in the art that, based upon the teachings herein, further changes and modifications may be made without departing from the disclosure and its broader aspects. Therefore, the appended claims are to encompass within their scope all such changes, modifications and equivalents as are within the true spirit and scope of this disclosure. For example, the audio amplifier 10 is described to assume the form of a noninverting amplifier 12 and an inverting amplifier 11, but other amplifier arrangements are contemplated by the disclosure. What is significant is that the amplifier has a configuration that selectively enables either balanced or bridged-mode operation. As is well known, such operation may be achieved through various design approaches, including differential amplifier configurations, or through the use of center-tapped output transformers. In addition, although the single-ended output to jack 40 is described for convenience to be taken from the noninverting amplifier, the single-ended output could easily be taken from the inverting amplifier. In the ramification, SW1 would then be deployed in the path between output 122 of amplifier 12 and speaker connection 21.

Furthermore, with respect to switches SW1 and SW2, for purposes of generality these switches are depicted as distinct switch elements. Those skilled in the art recognize that SW1 and SW2 may be implemented in the form of a single switch, with two poles. The switch, or switch elements, may be implemented in accordance with a number of techniques, including integrated or discrete semiconductor devices, mechanical switches, or microelectromechanical systems. The MAX 4298/MAX 4299 integrated circuit device from Maxim Integrated Products, 120 San Gabriel Drive, Sunnyvale, Calif., is an example of a commercially available product that incorporates an on-chip audio amplifier stage, a linear voltage regulator and logic-driven switches. However, the semiconductor switches on the MAX4298/4299 are used merely to mute the audio amplifier, and there is no suggestion, or opportunity, to reconfigure the switches incorporated therein so as to optimize voltage supply performance in response to the operating mode of the audio amplifier. Also, it is apparent that the description of the invention assumes "normal" operation to exist when headphones or the like are not connected to jack 40. Of course, this assumption represents merely a convention adopted to facilitate a description of the disclosure and, as such, is reversible, and SW1 and SW2 may be reconnected concomitantly.

In addition, it may be advantageous that the invention be implemented as an integrated circuit device, so that amplifiers 11 and 12, switches SW1 and SW2, and voltage regulator 60 be fabricated as a monolithic analog integrated circuit. However, the disclosure is not intended to be limited in this manner, and the system designer is free to partition these functions to one or more semiconductor devices as seen fit.

Finally, the disclosure has been described largely as a technique that accommodates either internal speakers or headphones; however, the disclosed concept is clearly extensible to any technique for the selection of voltage supplies in response to a users desire to avoid himself of one of a set of optional peripheral devices.

What is claimed is:

1. An audio system for use with a personal computer, the audio system comprising:
   a first voltage supply;
   a first switch;
   a second voltage supply coupled to the first voltage supply;
   a second switch;
   an audio amplifier including an inverting amplifier and a non-inverting amplifier, an input signal being coupled in parallel to each amplifier;
   an output of the noninverting amplifier being coupled to a first speaker output connection;
   an output of the inverting amplifier being coupled through the first switch to a second speaker output connection;
   a jack sense indicator coupled for driving the first switch and detecting connection of a listening device to a jack;
   in response to the jack sense indicator determining that the listening device is connected to the jack, the jack sense indicator causing the first switch to be driven open and a signal path between the inverting amplifier and the first speaker to be interrupted; and
   in response to the listening device being connected to the jack, the jack sense indicator causing the second switch to couple the non-inverting amplifier to the second voltage supply rather than to the first voltage supply.

2. An audio system as defined in claim 1, wherein the first voltage supply is derived from an AC power line.

3. An audio system as defined in claim 2, wherein the second switch and the second voltage supply are coupled to the first voltage supply via a voltage supply node.

4. A personal computer system comprising an audio system, the audio system comprising:
   a voltage supply subsystem having a first voltage supply and a second voltage supply coupled to the first voltage supply;
   an audio amplifier subsystem having a noninverting amplifier and an inverting amplifier, an input signal being coupled in parallel to each amplifier;
   a first switch and a second switch;
   an output of the noninverting amplifier being coupled to a first speaker output connection;
   an output of the inverting amplifier being coupled through the first switch to a second speaker output connection;
   a jack sense indicator coupled for driving the first switch and detecting connection of a listening device to a jack;
   in response to the jack sense indicator determining that the listening device is connected to the jack, the jack sense indicator causing the first switch to be driven open and a signal path between the inverting amplifier and the first speaker to be interrupted; and
   in response to the listening device being connected to the jack, the jack sense indicator causing the second switch to couple the non-inverting amplifier to the second voltage supply rather than to the first voltage supply.

5. A personal computer system as defined in claim 4, wherein the first voltage supply is derived from an AC power line.

6. An apparatus comprising:
   a personal computer chassis coupled to an audio system including:
   a first voltage supply;
   a first switch;
   a second voltage supply coupled to the first voltage supply;
   a second switch;
   an audio amplifier including an inverting amplifier and a non-inverting amplifier, an input signal being coupled in parallel to each amplifier;
   an output of the noninverting amplifier being coupled to a first speaker output connection;
   an output of the inverting amplifier being coupled through the first switch to a second speaker output connection;
   a jack sense indicator coupled for driving the first switch and detecting connection of a listening device to a jack;
   in response to the jack sense indicator determining that the listening device is connected to the jack, the jack sense indicator causing the first switch to be driven open and a signal path between the inverting amplifier and the first speaker to be interrupted; and
   in response to the listening device being connected to the jack, the jack sense indicator causing the second switch to couple the non-inverting amplifier to the second voltage supply rather than to the first voltage supply.

7. An apparatus as defined in claim 6, wherein the jack is connected between (i) either the inverting amplifier or the noninverting amplifier and (ii) GND.

8. An apparatus as defined in claim 6, wherein the first voltage supply is derived from an AC power source.

9. An apparatus as defined in claim 8, wherein the second switch and the second voltage supply are coupled to the first voltage supply via a voltage supply node.

10. In a personal computer, a method of supplying power to an audio amplifier, the method comprising:
    providing a voltage supply system that includes a first voltage supply and a second voltage supply coupled to the first voltage supply;
    providing a jack;
    providing a first switch and a second switch;
    providing an audio amplifier including an inverting amplifier and a noninverting amplifier, an input signal being coupled in parallel to each amplifier;
    coupling an output of the noninverting amplifier to a first speaker output connection;
    coupling an output of the inverting amplifier through the first switch to a second speaker output connection;
    coupling a jack sense indicator for driving the first switch and detecting connection of a listening device to a jack;
    in response to the jack sense indicator determining that the listening device is connected to the jack, the jack sense indicator causing the first switch to be driven open and a signal path between the inverting amplifier and the first speaker to be interrupted; and
    in response to the listening device being connected to the jack, the jack sense indicator causing the second switch to couple the non-inverting amplifier to the second voltage supply rather than to the first voltage supply.

* * * * *